United States Patent [19]

Nogami

[11] Patent Number: 4,507,169

[45] Date of Patent: Mar. 26, 1985

[54] METHOD AND APPARATUS FOR VAPOR PHASE GROWTH OF A SEMICONDUCTOR

[75] Inventor: Masaharu Nogami, Machida, Japan

[73] Assignee: Fujitsu Limited, Kawasaki, Japan

[21] Appl. No.: 392,074

[22] Filed: Jun. 25, 1982

[30] Foreign Application Priority Data

Jun. 29, 1981 [JP] Japan ............................... 56-101087

[51] Int. Cl.³ .................... C30B 25/10; B05D 5/12; C23C 13/04
[52] U.S. Cl. .................................. 156/606; 156/614; 156/DIG. 70; 156/DIG. 81; 118/719; 118/729; 427/85; 427/87
[58] Field of Search ................. 156/603, 606, 612–614, 156/DIG. 70, DIG. 81, DIG. 88; 148/175; 427/85–87; 118/719, 726, 727, 729, 730

[56] References Cited

U.S. PATENT DOCUMENTS

| 3,184,348 | 5/1965 | Marinace | 148/174 |
|---|---|---|---|
| 3,901,746 | 8/1975 | Boucher | 156/606 |
| 3,925,118 | 12/1975 | Hollan | 118/729 |
| 4,030,949 | 6/1977 | Horikoshi et al. | 156/612 |
| 4,116,733 | 9/1978 | Olsen et al. | 156/612 |
| 4,137,108 | 1/1979 | Ihara et al. | 156/612 |

FOREIGN PATENT DOCUMENTS

| 1308356 | 12/1961 | France | |
| 2133498 | 4/1971 | France | |
| 17066 | 2/1978 | Japan | 156/614 |
| 17067 | 2/1978 | Japan | 156/614 |
| 2300 | 1/1979 | Japan | 156/613 |
| 136199 | 10/1980 | Japan | 156/613 |

OTHER PUBLICATIONS

Japanese Journal of Applied Physics, vol. 19, No. 2, Feb. 1980, T. Mizutani et al.: "Vapor phase growth of InGaAsP/InP DH structures by the dual-growth-chamber method".

Primary Examiner—David L. Lacey
Attorney, Agent, or Firm—Staas & Halsey

[57] ABSTRACT

An apparatus for the vapor phase growth of a semiconductor multilayer film on a semiconductor substrate is provided with an additional reaction tube arranged in a main reaction tube. The additional reaction tube accommodates a source material and forms an independent vapor phase growth zone therein. The method includes forming one semiconductor layer of the multilayer film within the additional reaction tube and forming another semiconductor layer of the multilayer film outside the additional reaction tube.

6 Claims, 5 Drawing Figures

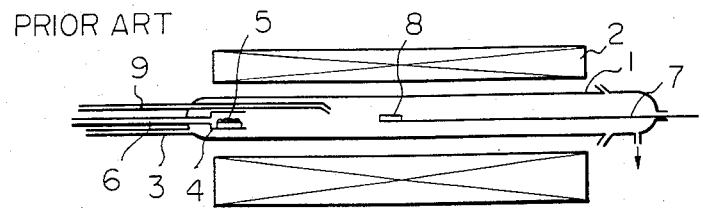
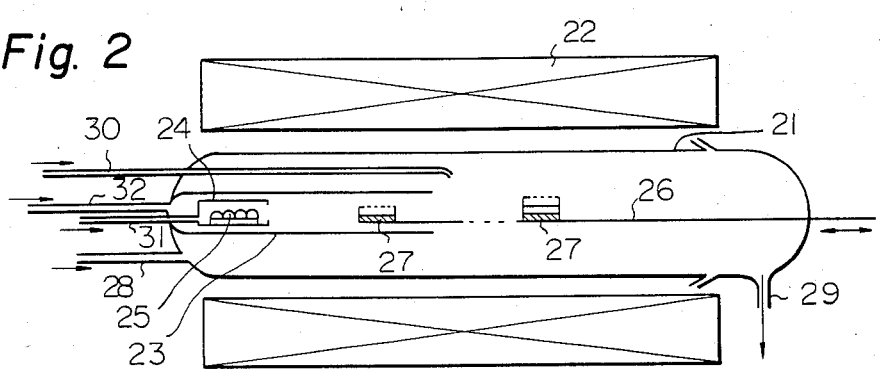
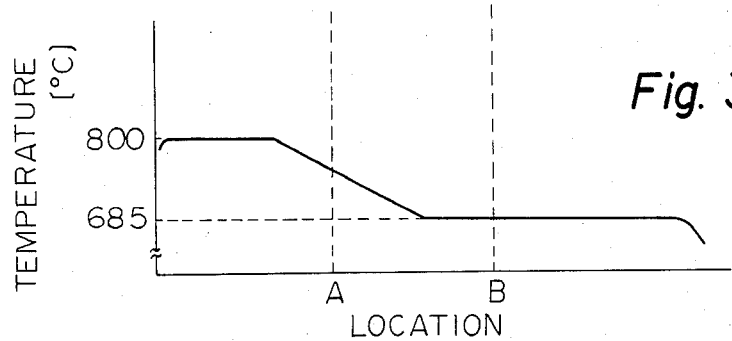

METHOD AND APPARATUS FOR VAPOR PHASE GROWTH OF A SEMICONDUCTOR

BACKGROUND OF THE INVENTION

1. Field of the Invention

This invention relates to vapor phase growth of a semiconductor. More particularly, it relates to a method for the vapor phase epitaxial growth of a semiconductor multilayer film on a semiconductor substrate and an apparatus for carrying out the vapor phase epitaxial growth method.

2. Description of the Prior Art

The vapor phase growth method is a method in which a thin single crystalline film layer is deposited on a single crystalline substrate by means of a vapor phase reaction, and this method is widely used in the production of semiconductor elements. It is possible to grow continuously single crystalline layers as a multilayer film on a substrate by means of the vapor phase growth method. The vapor phase growth method in the case of a compound semiconductor is used in the production of semiconductor elements, such as field effect transistors (FETs), Gunn diodes, impact avalanche transit time (IMPATT) diodes, semiconductor lasers, luminescent diodes, and Hall devices. For example, the vapor phase growth of gallium arsenide (GaAs) is well-known (cf. J. M. Durand, "Influence of the Growth Parameters in GaAs Vapour Phase Epitaxy," Philips Journal of Research, Vol. 34, Nos. 5/6, 1979, pp. 177–210).

FIG. 1 is a schematic illustration of a conventional horizontal-type apparatus for carrying out the vapor phase growth of GaAs. The apparatus comprises a reaction tube 1, a heating furnace 2 surrounding the reaction tube 1, an inlet pipe 3 for feeding a carrier gas (e.g., hydrogen gas), a container 4 for accommodating the gallium (Ga) source 5 and being provided with an inlet pipe 6 for feeding arsenic trichloride ($AsCl_3$) and a carrier gas (e.g., hydrogen gas), a supporting means 7 for a single crystalline substrate 8 of GaAs, and a pipe 9 for feeding a doping agent (e.g., sulfur). A desired temperature profile within the reaction tube 1 is generated by the heating furnace 2. The carrier gas (hydrogen gas) flows from the inlet pipe 3 and another carrier gas (hydrogen gas) entraining arsenic trichloride vapor flows into the container 4 from the pipe 6. The Ga source 5, the hydrogen ($H_2$), and the arsenic trichloride ($AsCl_3$) react so that a GaAs epitaxial layer is deposited on the GaAs substrate 8. When the doping agent (sulfur) entrained by the carrier gas (hydrogen gas) is introduced into the reaction tube 1 from the pipe 9, a GaAs epitaxial layer doped with sulfur can be obtained. Therefore, it is possible to form a GaAs multilayer film comprising a GaAs epitaxial layer grown without a doping treatment and a GaAs epitaxial layer grown with a doping treatment on the GaAs substrate.

In a case where the formation of a GaAs multilayer film is repeated by using the conventional apparatus illustrated in FIG. 1, if a GaAs epitaxial doped layer having a doping impurity concentration of $1 \times 10^{18}$ cm$^{-3}$ or more is grown, a part of the doping impurities are contained in another GaAs layer accumulated gradually on the inside surface of the reaction tube 1 and diffuse into (i.e., contaminate) the Ga source 5. As a result, when a GaAs epitaxial layer without a doping treatment is grown, the contained and contaminating doping impurities are volatile and are incorporated into the layer to be grown so that the resistivity of the obtained GaAs layer is lowered due to the undesired amount of doping impurities. Namely, it is difficult to grow an undoped high-resistance GaAs layer having a good reproducibility. In order to eliminate this disadvantage, the GaAs layer gradually accumulated on the inside surface of the reaction tube 1 and containing the doping impurities should be removed from the surface of the reaction tube and the contaminated Ga source 5 should be replaced with a new Ga source. In this case, problems exist in that the period of time necessary to carry out the vapor phase etching treatment in the reaction tube is relatively long, e.g., from 1 to 2 hours, and in that the Ga source must frequently be replaced.

A GaAs epitaxial layer is formed by means of vapor phase growth under either diffusion controlled conditions or kinetically controlled conditions.

In the case where vapor phase growth is carried out under diffusion controlled conditions, variation in the thickness of the GaAs epitaxial layer formed on a GaAs single crystalline substrate is considerably influenced by the growth conditions, such as the growth temperature, the flow rate of the fed gas, the molar fraction of $AsCl_3$, and the temperature gradient (temperature profile) within the reaction tube. Therefore, the growth conditions must be controlled very precisely. Accordingly, the reproducibility of the epitaxial layer is poor, and it is difficult to form an epitaxial layer having a high uniform thickness on a single crystalline substrate with a large area. However, a high-resistance undoped epitaxial layer having a better reproducibility can be obtained, as compared to the case in which vapor phase growth is carried out under kinetically controlled conditions.

In the case where the epitaxial layer is grown under kinetically controlled conditions, the above-mentioned growth conditions need not be controlled as precisely as when the epitaxial layer is grown under diffusion controlled conditions and it is possible to obtain an epitaxial layer having a high uniform thickness and a high uniform doping impurity concentration on a large substrate. However, since the molar fraction of $AsCl_3$ is relatively low, it is difficult to obtain a high-resistance undoped layer having a good reproducibility.

If a multilayer film is grown under diffusion controlled conditions and kinetically controlled conditions alternately created in the conventional vapor phase growing apparatus illustrated in FIG. 1, the time necessary for alternating between the diffusion controlled conditions and the kinetically controlled conditions is not short, and, therefore, defects and extraneous grown layers are generated at the interface between the continuously grown epitaxial layers. Accordingly, in the conventional apparatus, the multilayer film is formed under either diffusion controlled conditions or kinetically controlled conditions.

SUMMARY OF THE INVENTION

It is a primary object of the present invention to form a multilayer epitaxial layer having a high quality and a high uniform thickness by means of the vapor phase growth of a compound semiconductor having a good reproducibility.

It is another object of the present invention to reduce the vapor phase etching time of a reaction tube and the number of times the source material must be replaced during the repeated growth of a multilayer film comprising an undoped epitaxial layer and a doped epitaxial layer.

It is yet another object of the present invention to carry out vapor phase growth by suitably creating a region with diffusion controlled conditions and a region with kinetically controlled conditions in the reaction tube of a vapor phase growth apparatus.

Further, it is another object of the present invention to provide a method and an apparatus for carrying out vapor phase growth so as to attain the above-mentioned objects.

In accordance with the present invention, a vapor phase growth apparatus is provided with an additional (second) reaction tube, arranged in the main (first) reaction tube, which is of such a length that a first vapor phase growth zone can be formed independently from a second vapor phase growth zone in the first reaction tube, thereby making possible the growth of one semiconductor layer of a semiconductor multilayer film within the second reaction tube and the growth of another semiconductor layer outside the second reaction tube, respectively.

BRIEF DESCRIPTION OF THE DRAWINGS

FIG. 1 is a schematic illustration of a conventional apparatus for carrying out the vapor phase growth of a compound semiconductor;

FIG. 2 is a schematic illustration of a vapor phase growth apparatus according to an embodiment of the present invention;

FIG. 3 is a diagram illustrating a temperature profile created within a reaction tube by a heating furnace according to the present invention;

DESCRIPTION OF THE PREFERRED EMBODIMENTS

Figure 4:
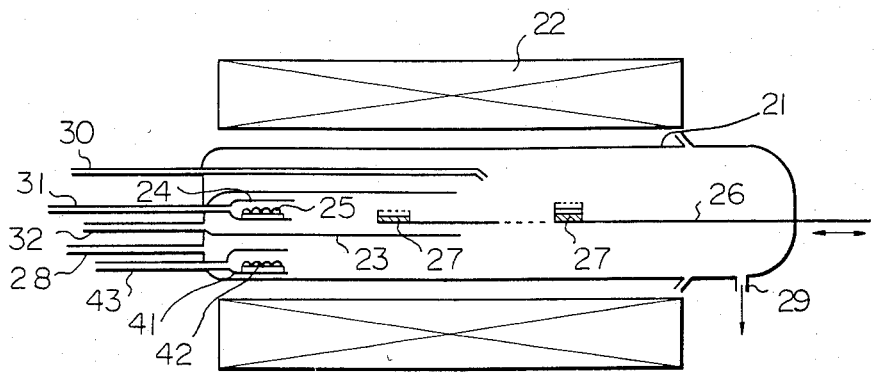
FIG. 4 is a schematic illustration of a vapor phase growth apparatus according to another embodiment of the present invention.

In FIG. 2, a vapor phase growth apparatus according to the present invention comprises a first reaction tube 21, a heating furnace 22 surrounding the tube 21, a second reaction tube 23 arranged in the first tube 21, a container 24 for accommodating a source material 25 arranged in the second tube 23, and a supporter 26 for transferring a compound semiconductor single crystalline substrate 27. The first reaction tube 21 is provided with an inlet pipe 28 for a carrier gas, an exhaust pipe 29, and a pipe 30 for feeding the doping agent into the first reaction tube 21. The end of the pipe 30 opens downstream from the second reaction tube 23. The container 24 is provided with an inlet pipe 31 for a reaction gas, and the second reaction tube 23 is provided with an inlet pipe 32 for a carrier gas. The supporter 26 is driven so as to transfer the substrate 27 to the inside of the second reaction tube 23 (corresponding to location A in FIG. 3), to the outside of the second tube 23 (corresponding to location B in FIG. 3), and to the outside of the first reaction tube 21. The heating furnace 22 generates a desired temperature profile within the first reaction tube 21 including the second reaction tube 23 for the vapor phase growth of a compound semiconductor epitaxial layer.

The formation of a multilayer film by using the above-mentioned vapor-phase growth apparatus is now explained.

A carrier gas, e.g., $H_2$ gas or a mixture of $H_2$ gas and an inert gas, flows through the inlet pipes 28 and 32 into the first and second reaction tubes 21 and 23, respectively, and the first reaction tube 21 is heated by the furnace 22 to form a predetermined temperature profile, e.g., as shown in FIG. 3. The source material 25, e.g., Ga, gallium arsenide (GaAs), indium (In), or indium phosphide (InP), and the compound semiconductor substrate 27 located in the second reaction tube 23 are heated at predetermined temperatures, respectively.

A reaction gas, e.g., $H_2$ gas entraining $AsCl_3$ vapor or phosphorus trichloride ($PCl_3$) vapor, flows through the inlet pipe 31 into the container 24 arranged within the second reaction tube 23. The reaction gas reacts on the source material 25 and a compound semiconductor (e.g., GaAs or InP) deposits on the substrate 27 within the second tube 23 to grow a first epitaxial layer. In this case, vapor phase growth can be carried out under either a diffusion controlled condition or kinetically controlled condition, depending upon the growth conditions.

After the formation of the first epitaxial layer, the substrate 27 is drawn out of the second reaction tube 23 by the supporter 26 and is placed in a suitable location downstream from the second reaction tube 23, as illustrated in FIG. 2. The substrate 27 is maintained in this location at a predetermined temperature which is lower, equal to, or higher than that at the location for forming the first epitaxial layer. The doping agent (impurity), e.g., sulfur (S), entrained by $H_2$ gas or a mixture of $H_2$ gas and an inert gas, is introduced into the first reaction tube 21 through the pipe 30. Thus, a second epitaxial doped layer is continuously grown on the first epitaxial layer to form a multilayer film on the substrate 27. In this case, vapor phase growth of the second epital layer can be carried out under either a diffusion controlled condition or kinetically controlled condition.

The flow of the reaction gas through the pipe 31 and the flow of the doping agent through the pipe 30 is stopped, and the heating temperature of the furnace 22 is reduced so as to cool the vapor-phase growth apparatus. The carrier gas flows continuously from the pipes 28 and 32. After the compound semiconductor substrate 27 with a multilayer film is cooled to a predetermined temperature, the substrate 27 is removed from the first reaction tube 21.

Prior to the formation of another above-mentioned multilayer film on a new substrate, the vapor phase etching of a compound semiconductor and a doping agent on the surface of the first and second reaction tubes 21 and 23 is carried out by feeding $H_2$ gas entraining $AsCl_3$ vapor or $PCl_3$ vapor from the pipes 28, 30, and 32 into the reaction tubes 21 and 23, which are heated at a temperature of from 800° to 850° C. In this case, $H_2$ gas or a mixture of $H_2$ gas and an inert gas flows from the pipe 31.

A vapor phase growth apparatus according to another embodiment of the present invention is illustrated in FIG. 4 and is different from the apparatus illustrated in FIG. 2 in that the former apparatus comprises an additional container 41 for accommodating a source material 42 between the second reaction tube 23 and the first reaction tube 21. The container 41 is provided with an inlet pipe 43 for a reaction gas and is movable. The reference numerals 21 through 32 in FIG. 4 indicate the same parts indicated by the same numerals in FIG. 2. For example, the source material 42 is Ga or In, and $AsCl_3$ or $PCl_3$ vapor entrained by $H_2$ is introduced into the container 41 through the pipe 43. Installation of the container 41 can increase the favorability of the growth conditions. Furthermore, the container 41 can be shifted to a location different from that of the container 24 so that the container 41 can be heated at a different temperature from that of the container 24, thereby contributing to enhancement of favorability of the growth conditions.

EXAMPLE

A multilayer GaAs film for a GaAs field effect transistor (FET) was grown in accordance with the vapor phase growth method utilizing the Ga-AsCl$_3$-H$_2$ system.

The temperature profile shown in FIG. 3 was created within the first reaction tube 21 by the furnace 22. The Ga source material 25 was heated at 800° C., and a GaAs single crystalline substrate 27 was placed in location A, corresponding to the inside of the second reaction tube 23, so as to grow a first GaAs epitaxial layer (i.e., an undoped buffer layer) and was heated at 745° C. When the substrate 27 was placed in location B, corresponding to the outside of the reaction tube 23, so as to grow a second GaAs epitaxial layer (i.e., a doped active layer), it was heated at 685° C.

A H$_2$ carrier gas was fed into the second tube 23 through the pipe 32, and a reaction gas, i.e., H$_2$ gas entraining AsCl$_3$ vapor, was fed into the container 24 through the pipe 31 so as to grow a GaAs buffer epitaxial layer having a high resistivity on the 2-inch GaAs substrate 27 within the second reaction tube 23 (H$_2$ location A). The flow rate of the H$_2$ carrier gas and the partial pressure of AsCl$_3$ were controlled so as to establish a molar fraction (MF) of AsCl$_3$ of $2 \times 10^{-2}$ as one of the growth conditions. In this case, a GaAs buffer layer having a thickness of 4 $\mu$m, a doping element concentration of $3 \sim 6 \times 10^{13}$ cm$^{-3}$, and a resistivity of $1.5 \times 10^5 \Omega$ cm was formed under a diffusion controlled condition. During the vapor phase growth of the buffer layer, another H$_2$ carrier gas was fed into the first reaction tube 21 through the pipe 28.

The GaAs substrate 27 was transferred from the inside of the second reaction tube 23 (from location A identified in FIG. 3) to the outside of the second reaction tube 23 (to location B identified in FIG. 3) for a short period of approximately 3 seconds. The temperature of the substrate 27 was decreased to 685° C. A sulfur (S) doping agent (element) entrained by H$_2$ gas was fed into the first reaction tube 21 through the pipe 30, and the H$_2$ carrier gas from the pipe 32, the reaction gas from the pipe 31, and the other H$_2$ carrier gas from the pipe 28 were continuously fed into the first reaction tube 21 at the predetermined flow rates so as to grow an GaAs active epitaxial layer on the buffer layer. In this case, a molar fraction of AsCl$_3$ of $8.4 \times 10^{-4}$ was established as one of the growth conditions. Thus, a GaAs active layer having a thickness of 0.3 $\mu$m and a doping element concentration of $1 \times 10^{17}$ cm$^{-3}$ was formed on the GaAs buffer layer under the kinetically controlled condition. Thereafter, the amount of the doping agent only was increased while the other conditions for vapor phase growth were not changed. Thus, a GaAs high doped layer (i.e., a GaAs contact layer for contact with source and drain electrodes having a doping element concentration of $1-2 \times 10^{18}$ cm$^{-3}$ and a thickness of 0.2 $\mu$m) was formed on the GaAs active layer inside the tube 21, at location B. Accordingly, the GaAs multilayer film consisting of the buffer layer, the active layer, and the contact layer which were continuously grown was formed on the GaAs substrate 27.

The vapor phase growth apparatus was cooled and then the GaAs substrate 27 with the multilayer film was removed from the first reaction tube 21.

It was found that the obtained GaAs active layer had such high uniformities that variation in the thickness was $\pm 1\%$ and variation in the doping element concentration was $\pm 2.5\%$.

In order to form the above-mentioned multilayer film on a new GaAs single crystalline substrate, the new GaAs substrate was inserted into the first reaction tube. Hydrogen gas entraining AsCl$_3$ vapor was fed through the pipes 28, 30, and 32, H$_2$ gas only was fed through the pipe 31, and the vapor phase growth apparatus was heated at 850° C. so that vapor phase etching of the reaction tube was carried out for approximately 30 minutes. Then the above-mentioned process of vapor phase growth of the multilayer film was repeated.

The above-mentioned vapor phase growth of GaAs and vapor phase etching of the reaction tube were repeated ten times. The resistivity of the GaAs buffer (high-resistance) layer of the obtained epitaxial wafers was measured as follows. A 5 mm square was cut out of each of the obtained epitaxial wafers and then the doped layer (i.e., the high-concentration layer and the active layer) were removed by etching. The undoped layer (i.e., the buffer layer) was selectively etched so as to pattern it into a cloverleaf shape and was evaluated for resistivity by means of the Pauw method. The obtained results are indicated by the curve "a" in FIG. 5.

As a comparative example, a GaAs multilayer film was formed on a GaAs substrate in a conventional vapor phase growth appatatus. The Ga source and the substrate were heated at 800° C. and 685° C., respectively. The flow rate of the H$_2$ carrier gas and the partial pressure of AsCl$_3$ in the reaction gas were controlled so as to establish a molar fraction of AsCl$_3$ of $8.4 \times 10^{-4}$. When doped layers (i.e., an active layer and a high-concentration layer) were grown, a sulfur doping agent entrained by a H$_2$ gas was introduced into the reaction tube. Thus, a GaAs undoped layer (i.e., a buffer layer), an active layer, and a high-concentration layer were continuously grown on the GaAs substrate. The amount of the fed doping agent was the same as that in the case of the example of the present invention. After the GaAs substrate with the multilayer film was removed from the reaction tube, a new GaAs substrate was inserted into the tube. Vapor phase etching was carried out under the same conditions as those in the case of the example of the present invention. Vapor phase growth of the multilayer film and etching of the reaction tube were repeated ten times. The resistivity of the buffer layer of the obtained epitaxial wafers was measured in the same manner as that described in the example of the present invention. The obtained results are indicated by the curve "b" in FIG. 5.

Figure 5:
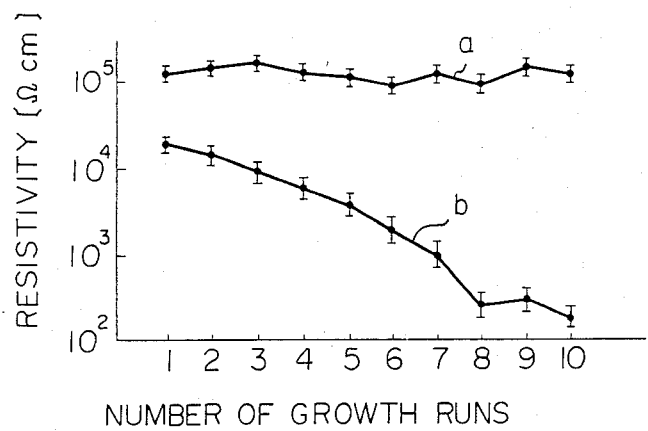
FIG. 5 is a diagram showing the relationship between the resistivity of the buffer layers and the number of growth runs according to the conventional method and method of the invention.

It is apparent from FIG. 5 that the vapor phase growth method of the present invention provides a good reproducibility of the resistivity of the buffer (undoped high-resistance) layer since the resistivity was substantially constant among the GaAs epitaxial wafers obtained in the ten growth runs of the example of the present invention. In the case of the comparative example, the resistivity of the buffer layer decreased as the number of growth runs increased.

According to the present invention, the growth zone for an undoped epitaxial layer is separated from the growth zone for a doped epitaxial layer by providing an additional reaction tube within the main reaction tube. Therefore, it is possible to prevent the doping agent from contaminating the undoped layer growth zone and from diffusing into the source material. It is also possible to control the growth conditions, such as the molar fraction of AsCl₃, the flow rates of the carrier gas and reaction gas, and the growth temperature, in the undoped layer growth zone and the doped layer growth zone independently. As a result, diffusion controlled conditions and kinetically controlled conditions can be suitably selected for the vapor phase growth of a compound semiconductor layer and can be suitably combined so as to form a multilayer film.

The present invention is not restricted to the above-mentioned embodiments and example, and many variations are possible for those skilled in the art without departing from the spirit and scope of the present invention. For example, in order to produce a Gunn diode or an IMPATT diode, it is possible to form a doped layer on a substrate, and then to form a high-resistance layer (i.e., an undoped layer) on the doped layer. If necessary, another doped layer is further formed on the high-resistance layer. In this case, first the doped layer can be formed outside the second reaction tube 23 (FIG. 2) of the apparatus according to the present invention and then the high-resistance layer can be formed within the second reaction tube. The vapor phase growth of a compound semiconductor, such as InAs, GaP, InGaAs, InGaP, or InGaAsP, in addition to the above-mentioned GaAs and InP can be carried out. It is possible to use a semiconductor wafer having an epitaxial layer which is formed in another vapor phase (or liquid phase) growth apparatus, as a semiconductor substrate. Furthermore, it is possible to provide a vertical-type vapor phase apparatus comprising a vertical reaction tube.

I claim:

1. A method for vapor phase epitaxial growth of a semiconductor multilayer film having a high-resistance layer and a low-resistance layer on a semiconductor substrate in a vapor phase growth apparatus having a first reaction tube and a second reaction tube which is arranged in the first reaction tube, said method comprising the steps of:

forming the high-resistance layer on the semiconductor substrate under a diffusion controlled condition within the second reaction tube, which has a temperature gradient region therein, in which a source material is placed, into which a reaction gas and a carrier gas are fed, and in which the semiconductor substrate is placed at the temperature gradient region; and forming the low-resistance layer on the high-resistance layer under a kinetically controlled condition within the first reaction tube in which the semiconductor substrate is placed outside the second reaction tube at a constant temperature region and into which a gas containing a doping agent and a carrier gas are fed.

2. A method according to claim 1, wherein the epitaxially grown semiconductor multilayer film is a compound semiconductor selected from the group consisting of GaAs, InP, InAs, GaP, InGaAs, InGaP and InGaAsP.

3. A method according to claim 1, wherein the growth conditions within the second reaction tube are controlled independently from the growth conditions outside the second reaction tube within the first reaction tube.

4. An apparatus for the vapor phase epitaxial growth of a semiconductor comprising:

a first reaction tube having an inlet pipe for inputting a carrier gas into the first reaction tube;

a second reaction tube which is arranged within the first reaction tube, has a container therein for containing a semiconductor source material, and has an inlet pipe for inputting a reaction gas into the second reaction tube and an inlet pipe for inputting a carrier gas into the second reaction tube;

means, surrounding the first reaction tube, for heating the first and second reaction tubes and providing a temperature gradient region at a portion of said second reaction tube and a constant temperature region at a portion of said first reaction tube outside said second reaction tube;

means for inputting a doping agent into the constant temperature region of the first reaction tube; and a moveable supporter for a semiconductor substrate supporter positioned and arranged such that said substrate is transferred to the inside of the second reaction tube or to the outside of the second reaction tube.

5. An apparatus according to claim 4, wherein said apparatus comprises another container for containing another source material, said other container being arranged between the first and second reaction tubes and including an inlet pipe for a reaction gas.

6. An apparatus according to claim 4, wherein said means for inputting a doping agent comprises a pipe for feeding a doping agent into the first reaction tube outside the second reaction tube.

* * * * *

UNITED STATES PATENT AND TRADEMARK OFFICE
CERTIFICATE OF CORRECTION

PATENT NO. : 4,507,169
DATED : Mar. 26, 1985
INVENTOR(S) : Masaharu Nogami

It is certified that error appears in the above-identified patent and that said Letters Patent is hereby corrected as shown below:

```
Column 3, line 42, after "phase" insert --or epitaxial--.
Column 4, line 35, "epital" should be --epitaxial--.
Column 5, line 54, after "layer" (first occurrence) insert
     --having a low resistivity--.
Column 6, line 26, "layer" (first occurrence) should be
     --layers--.
```

Signed and Sealed this

Tenth Day of September 1985

[SEAL]

Attest:

DONALD J. QUIGG

Attesting Officer    Acting Commissioner of Patents and Trademarks - Designate